(12) United States Patent
Regensburger

(10) Patent No.: US 10,732,128 B2
(45) Date of Patent: Aug. 4, 2020

(54) HIERARCHICAL WAFER INSPECTION

(71) Applicant: CAMTEK LTD., Migdal Haemek (IL)

(72) Inventor: Menachem Regensburger, Shimshit (IL)

( * ) Notice: Subject to any disclaimer, the term of this patent is extended or adjusted under 35 U.S.C. 154(b) by 0 days.

(21) Appl. No.: 16/162,539

(22) Filed: Oct. 17, 2018

(65) Prior Publication Data

US 2019/0128822 A1 May 2, 2019

Related U.S. Application Data

(60) Provisional application No. 62/577,172, filed on Oct. 26, 2017.

(51) Int. Cl.
*G01N 21/95* (2006.01)
*G01N 21/88* (2006.01)
*H01L 21/66* (2006.01)

(52) U.S. Cl.
CPC ..... *G01N 21/9505* (2013.01); *G01N 21/8806* (2013.01); *H01L 22/20* (2013.01); *H01L 22/12* (2013.01)

(58) Field of Classification Search
CPC .......... G01N 21/9505; G01N 21/8806; G01N 21/9501; G01N 21/95607; G01N 21/956; H01L 22/10
USPC .......................................... 356/237.2–237.6
See application file for complete search history.

(56) References Cited

U.S. PATENT DOCUMENTS

| | | | |
|---|---|---|---|
| 2002/0118359 A1* | 8/2002 | Fairley | G01N 21/8806 356/237.2 |
| 2004/0115541 A1* | 6/2004 | Yamaguchi | G03F 1/84 430/30 |
| 2010/0140474 A1* | 6/2010 | Hamamatsu | G01N 21/8851 250/311 |

* cited by examiner

*Primary Examiner* — Isiaka O Akanbi
(74) *Attorney, Agent, or Firm* — Reches Patent

(57) ABSTRACT

There may be provided a method for evaluating an object, that may include evaluating a region of the object by a first evaluation module to provide first evaluation results that are related to multiple sites of the region; finding, using a mapping between values of first evaluation results and values of second evaluation results, (a) a first site of the multiple sites that does not require an evaluation by a second evaluation module, and (b) a second site of the multiple sites that requires an evaluation by the second evaluation module; wherein the second evaluation module is more reliable than the first evaluation module; evaluating the second site by the second evaluation module to provide second evaluation results of the second sites; estimating, based on first evaluation results of the first site and on the mapping, a state of the first site; and providing an evaluation of the region based on the state of the first site, and on the second evaluation result of the second site.

21 Claims, 15 Drawing Sheets

HIERARCHICAL WAFER INSPECTION

CROSS REFERENCE

Figure 1:
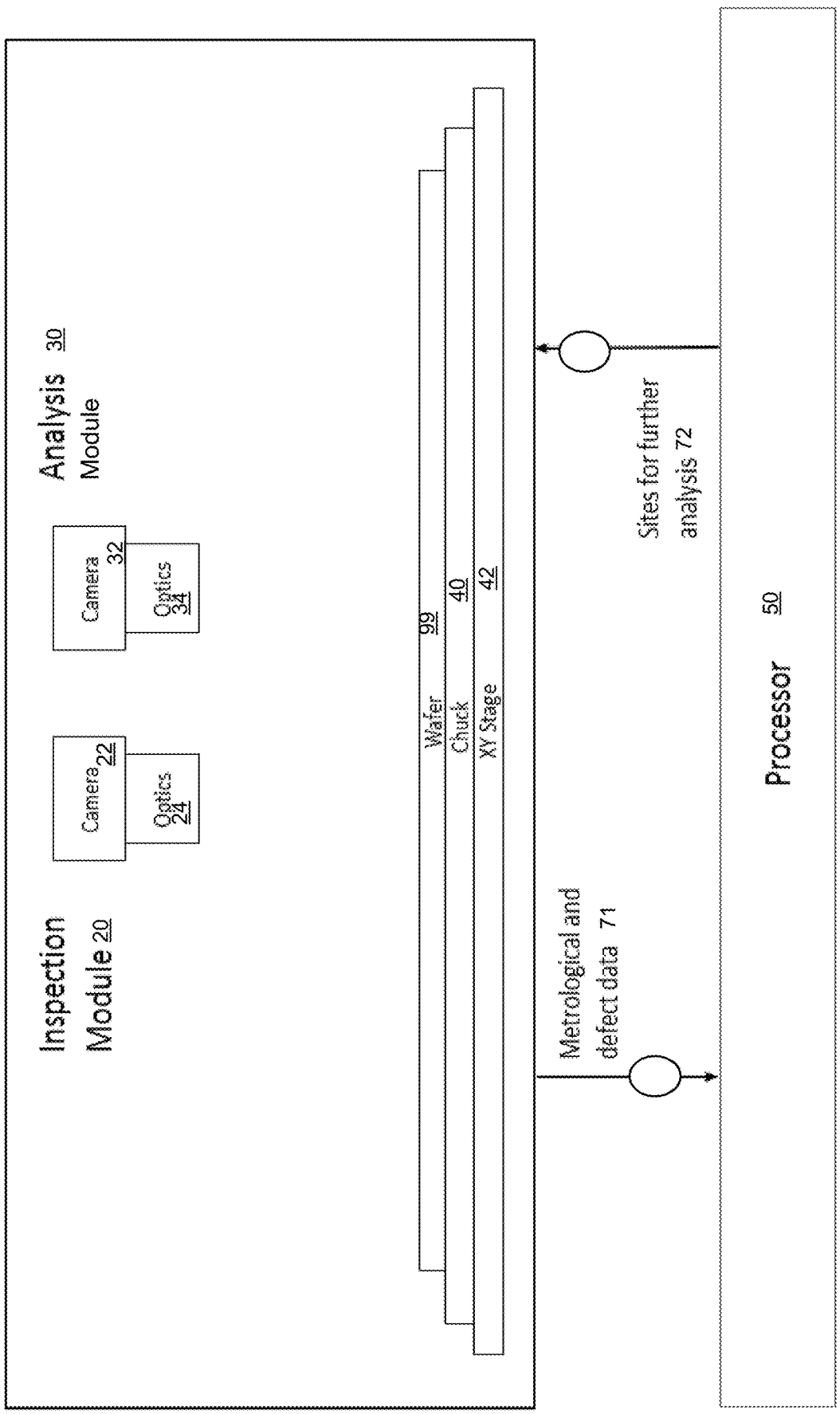

This application claims priority from U.S. provisional patent 62/577,172 filing date Oct. 26, 2017.

BACKGROUND OF THE INVENTION

Throughout the production process of wafer production, a variety of steps are controlled and monitored in order to increase production yield.

As the inspection process represents an additional cost of machines and production time, there is a drive to achieve a result in a minimum cost.

SUMMARY

There may be provided a method for evaluating an object, the method may include evaluating a region of the object by a first evaluation module to provide first evaluation results that are related to multiple sites of the region; finding, using a mapping between values of first evaluation results and values of second evaluation results, (a) a first site of the multiple sites that does not require an evaluation by a second evaluation module, and (b) a second site of the multiple sites that requires an evaluation by the second evaluation module; wherein the second evaluation module is more reliable than the first evaluation module; evaluating the second site by the second evaluation module to provide second evaluation results of the second sites; estimating, based on first evaluation results of the first site and on the mapping, a state of the first site; and providing an evaluation of the region based on the state of the first site, and on the second evaluation result of the second site.

There may be provided a non-transitory computer readable medium for evaluating an object, that stores instructions for: evaluating a region of the object by a first evaluation module to provide first evaluation results that are related to multiple sites of the region; finding, using a mapping between values of first evaluation results and values of second evaluation results, (a) a first site of the multiple sites that does not require an evaluation by a second evaluation module, and (b) a second site of the multiple sites that requires an evaluation by the second evaluation module; wherein the second evaluation module is more reliable than the first evaluation module; evaluating the second site by the second evaluation module to provide second evaluation results of the second sites; estimating, based on first evaluation results of the first site and on the mapping, a state of the first site; and providing an evaluation of the region based on the state of the first site, and on the second evaluation result of the second site.

There may be provided system for evaluating an object, the system comprising a first evaluation module, a processor, and a second evaluation module; wherein the first evaluation module is configured to evaluate a region of the object to provide first evaluation results that are related to multiple sites of the region; wherein the processor is configured to find, using a mapping between values of first evaluation results and values of second evaluation results, (a) a first site of the multiple sites that does not require an evaluation by a second evaluation module, and (b) a second site of the multiple sites that requires an evaluation by the second evaluation module; wherein the second evaluation module is more reliable than the first evaluation module; wherein the second evaluation module is configured to evaluate the second site to provide second evaluation results of the second sites; wherein the processor is configured to estimate, based on first evaluation results of the first site and on the mapping, a state of the first site; and wherein the processor is configured to provide an evaluation of the region based on the state of the first site, and on the second evaluation result of the second site.

BRIEF DESCRIPTION OF THE INVENTION

Figure 2:
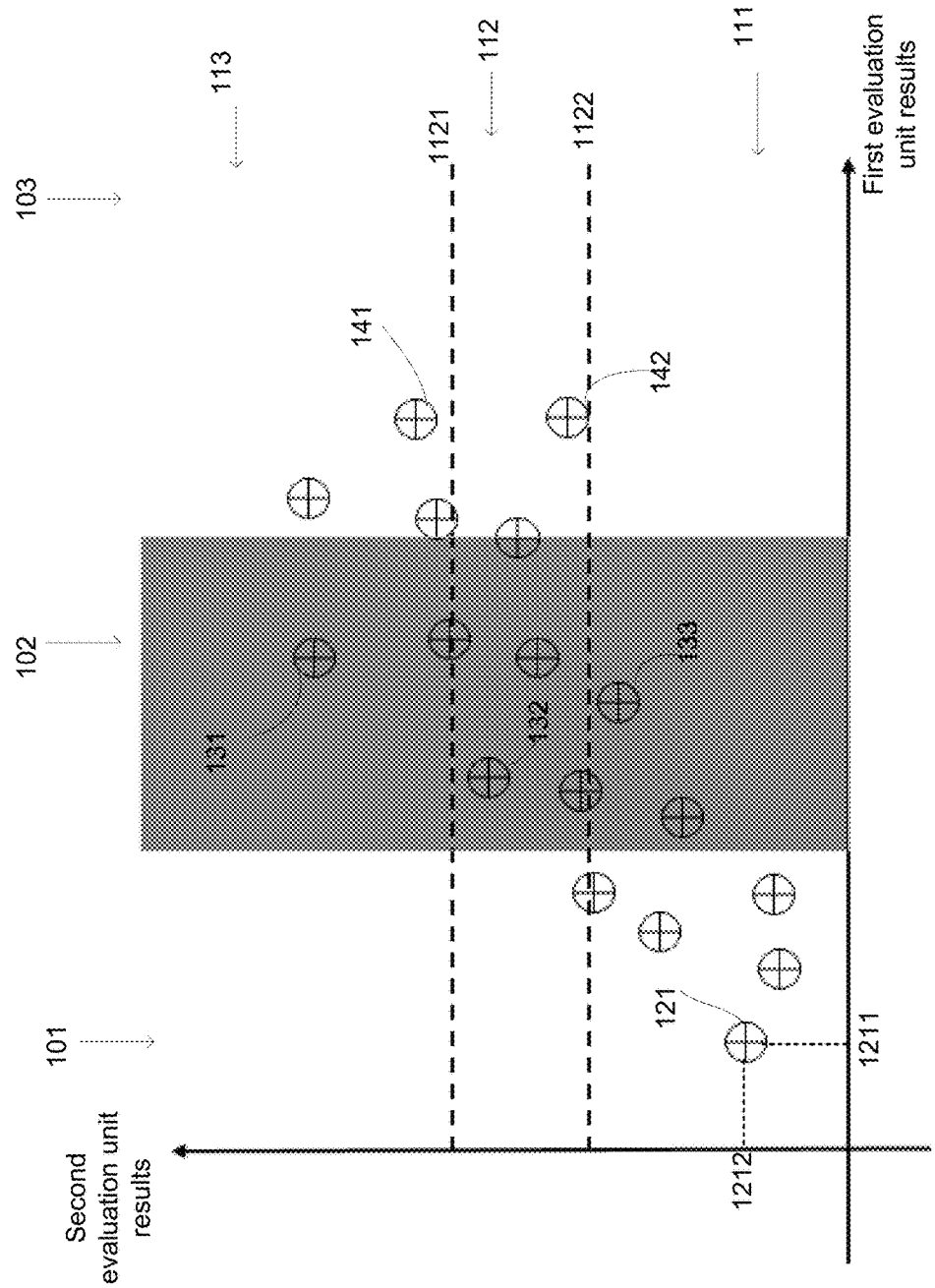
Figure 3:
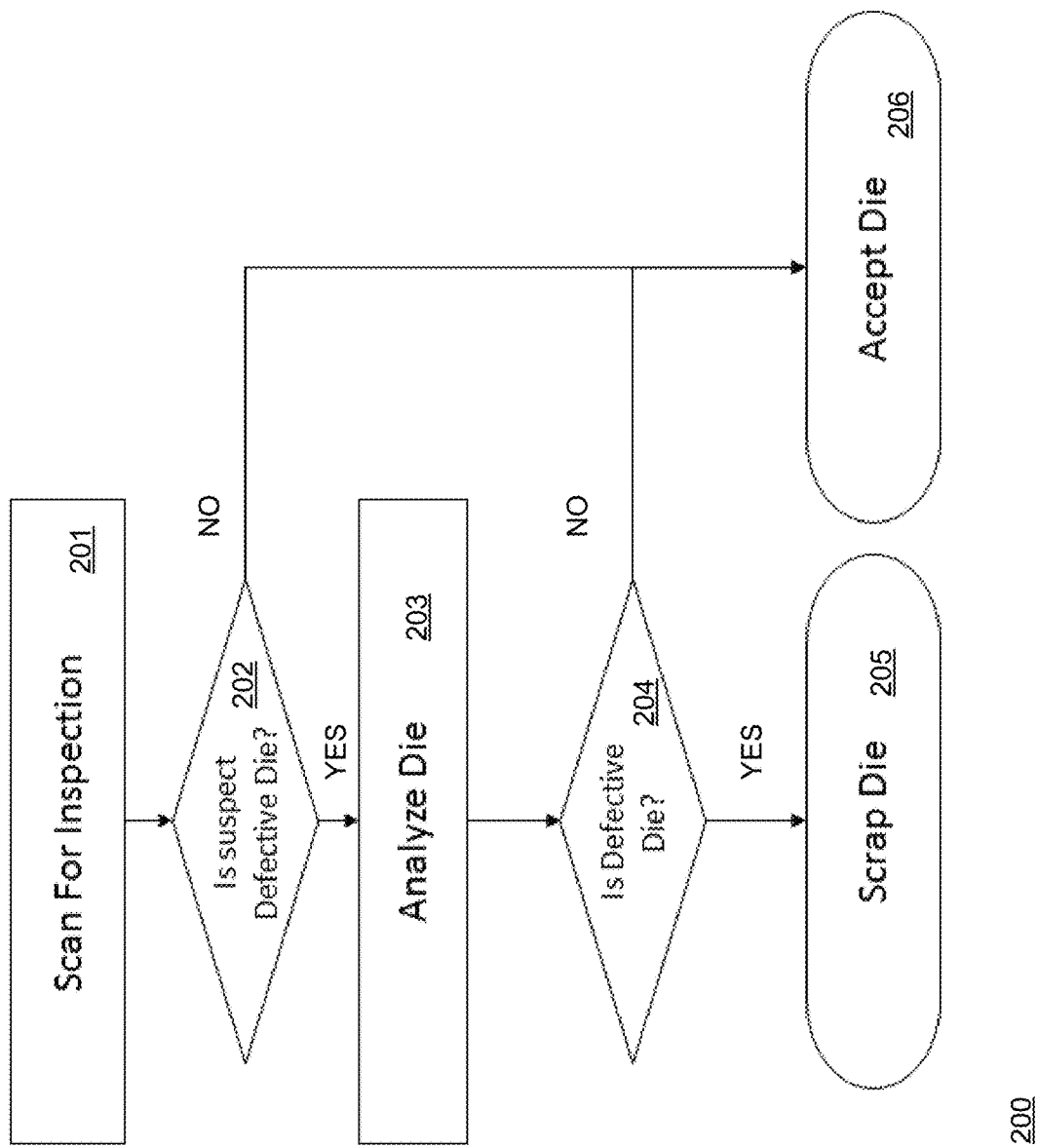
Figure 4:
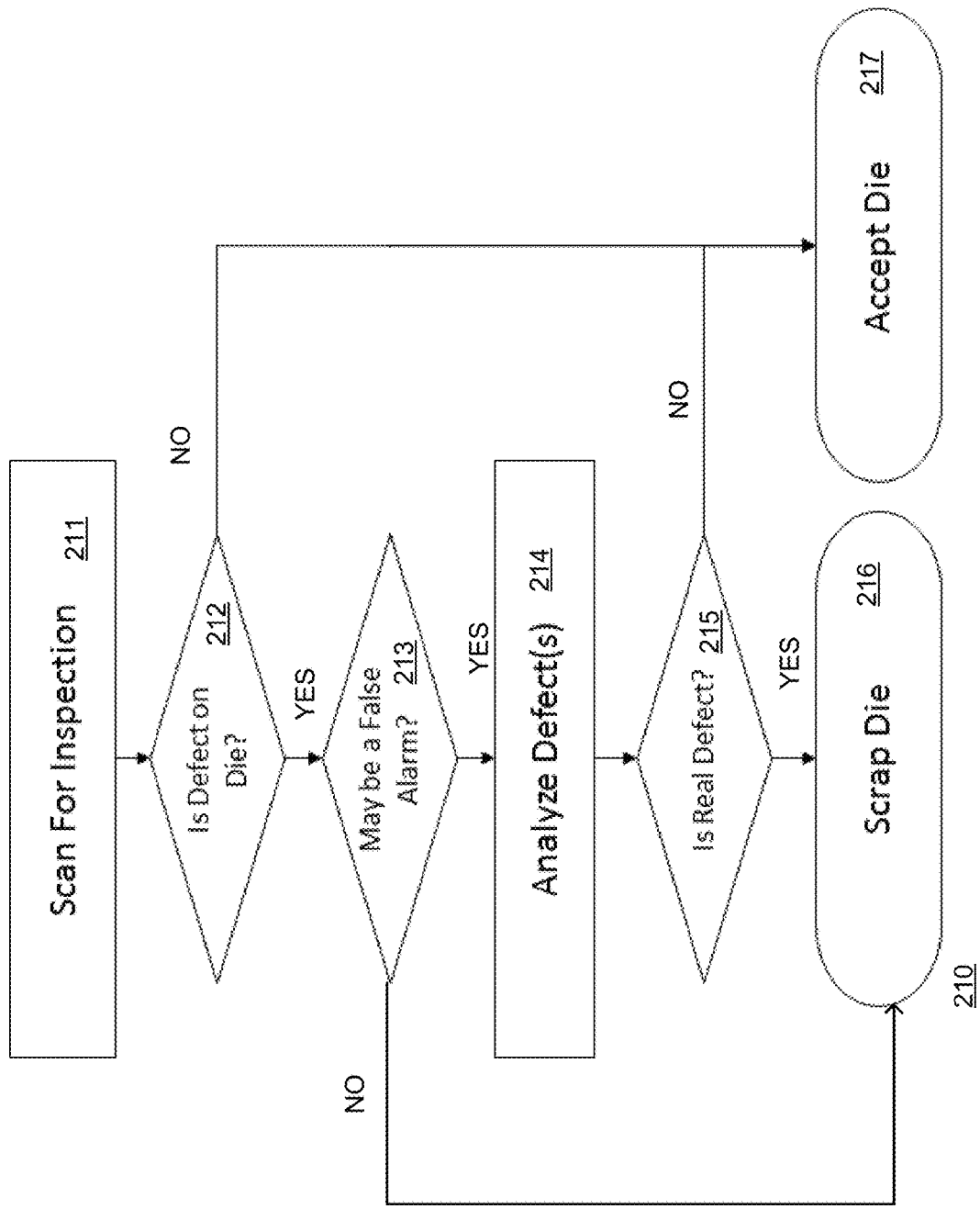
Figure 5:
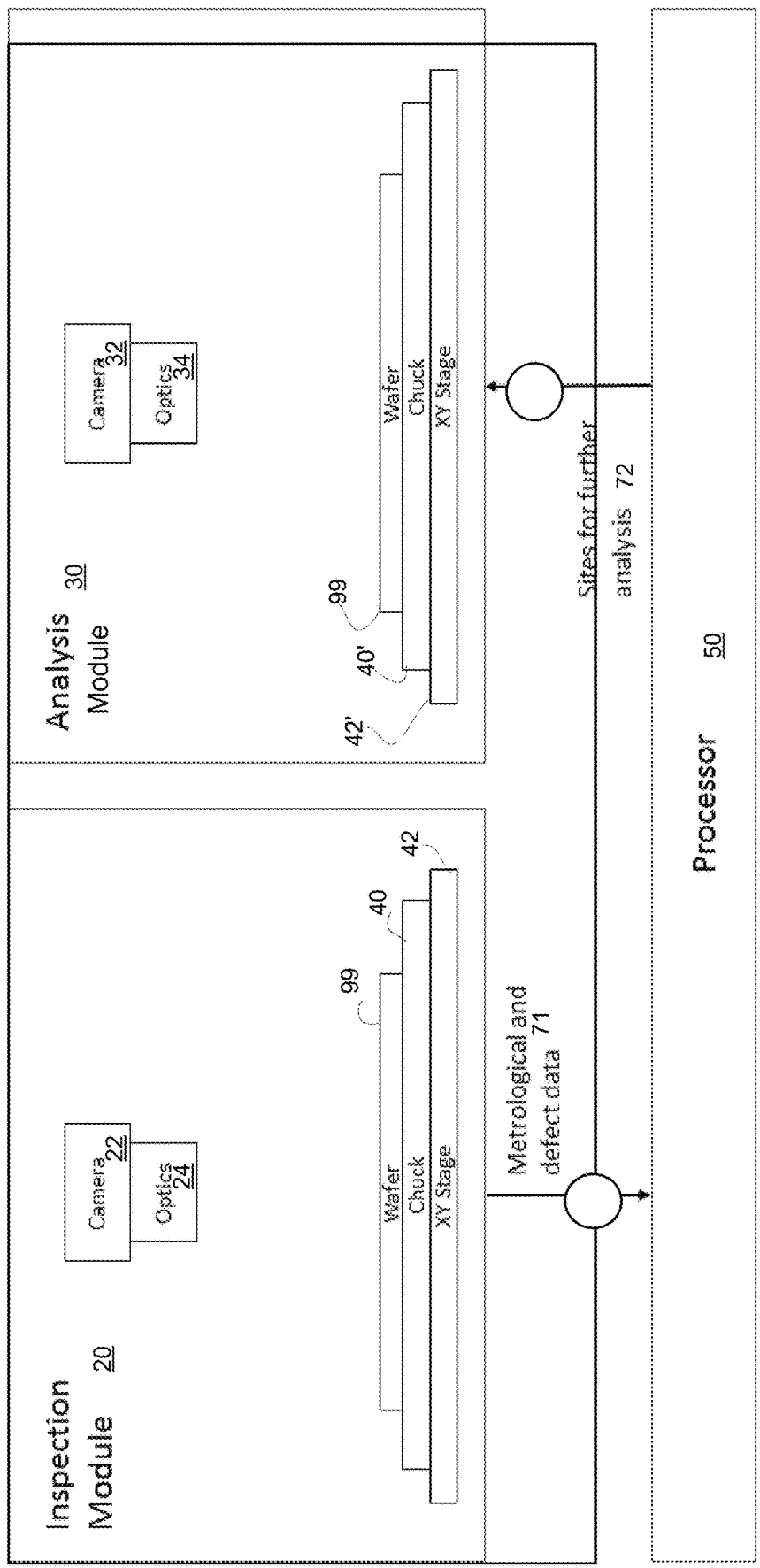
Figure 6:
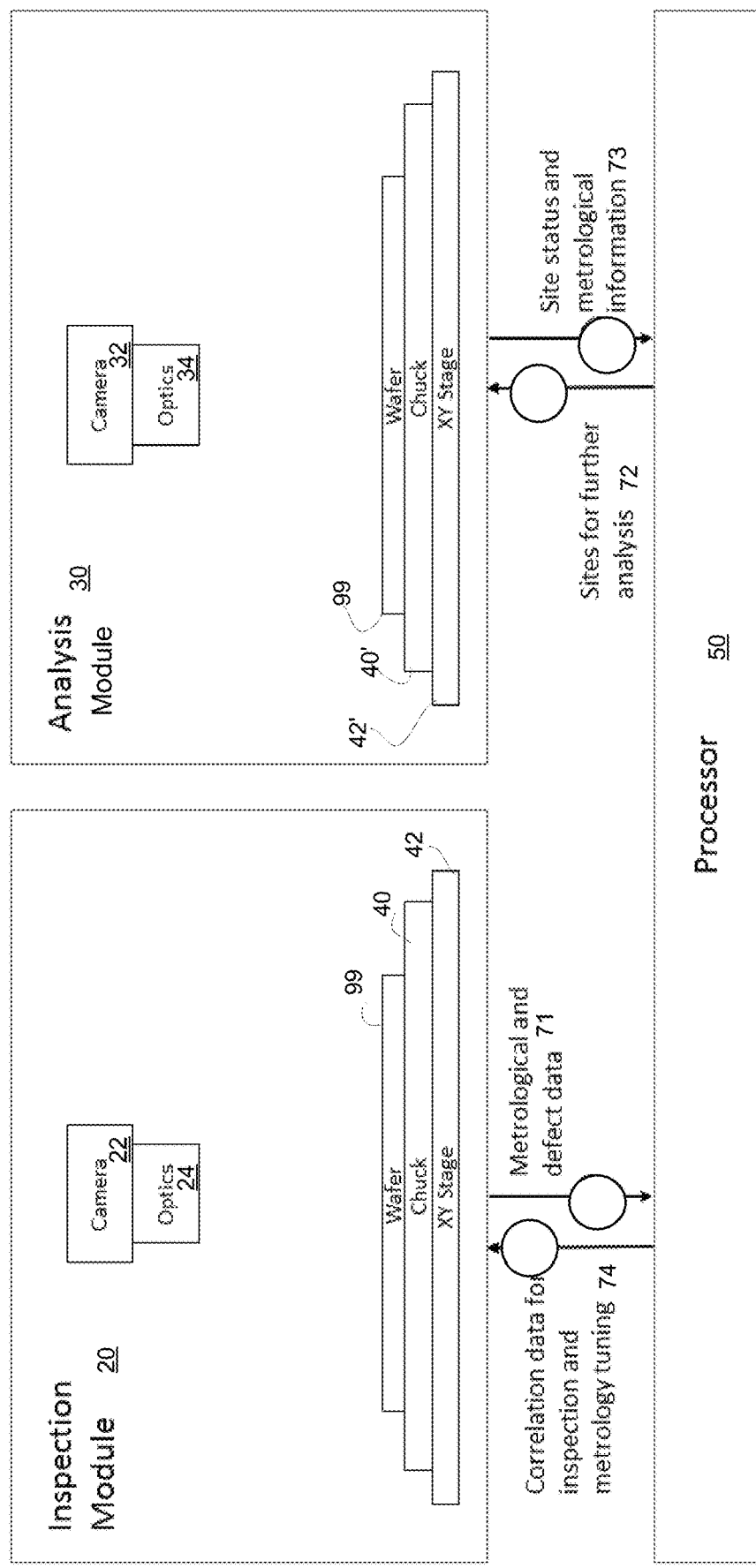
Figure 7:
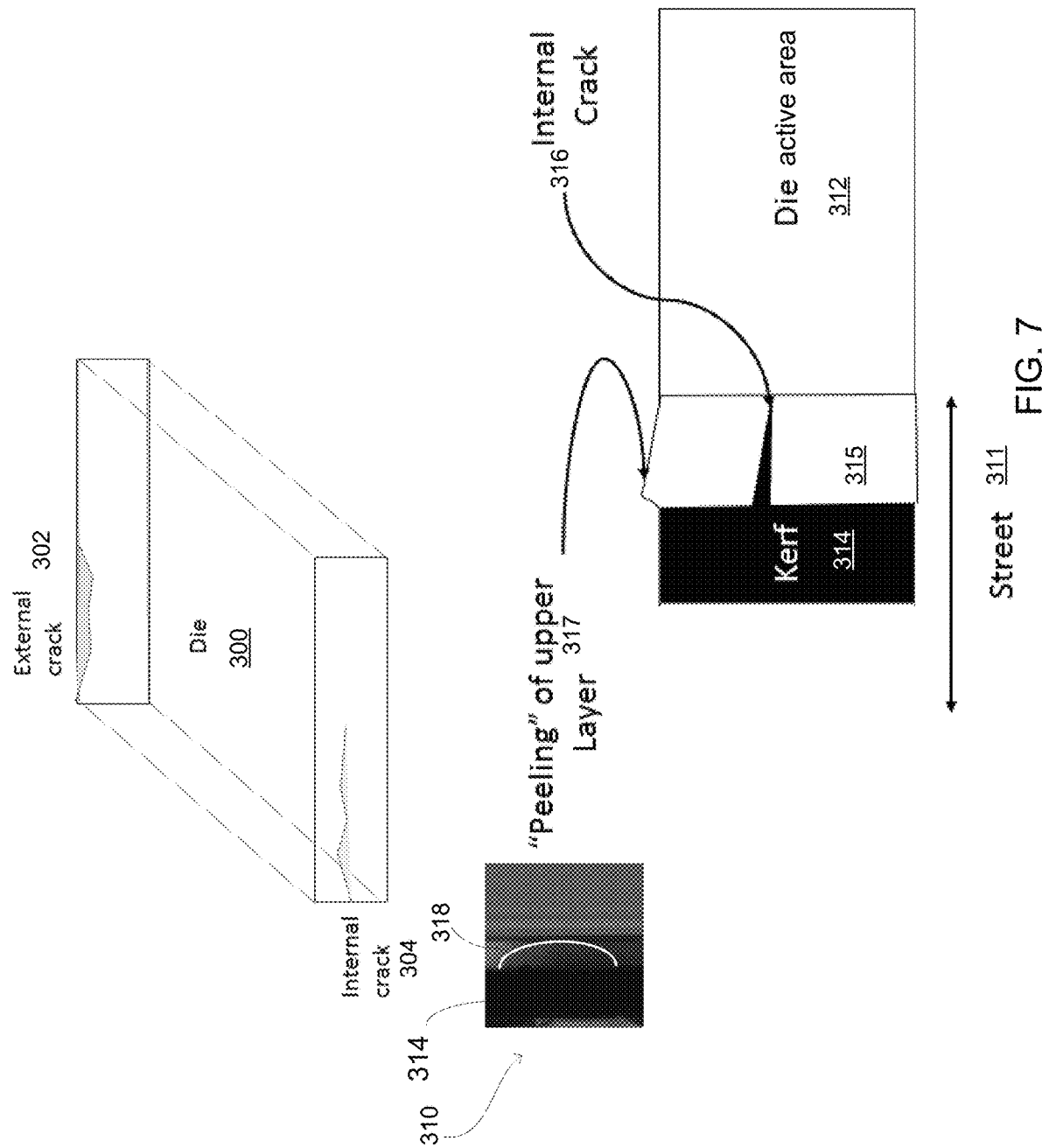
Figure 8:
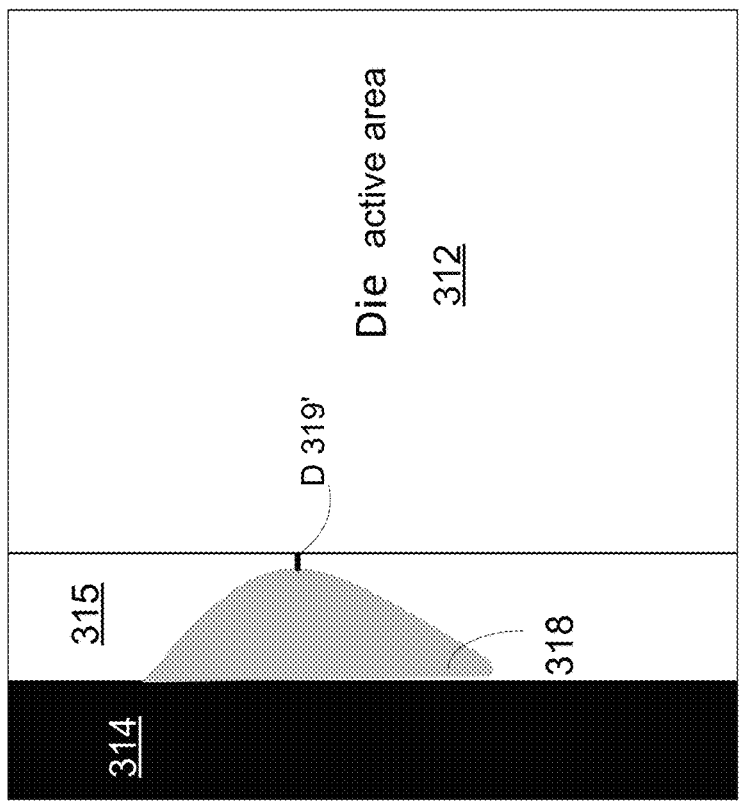
Figure 8:
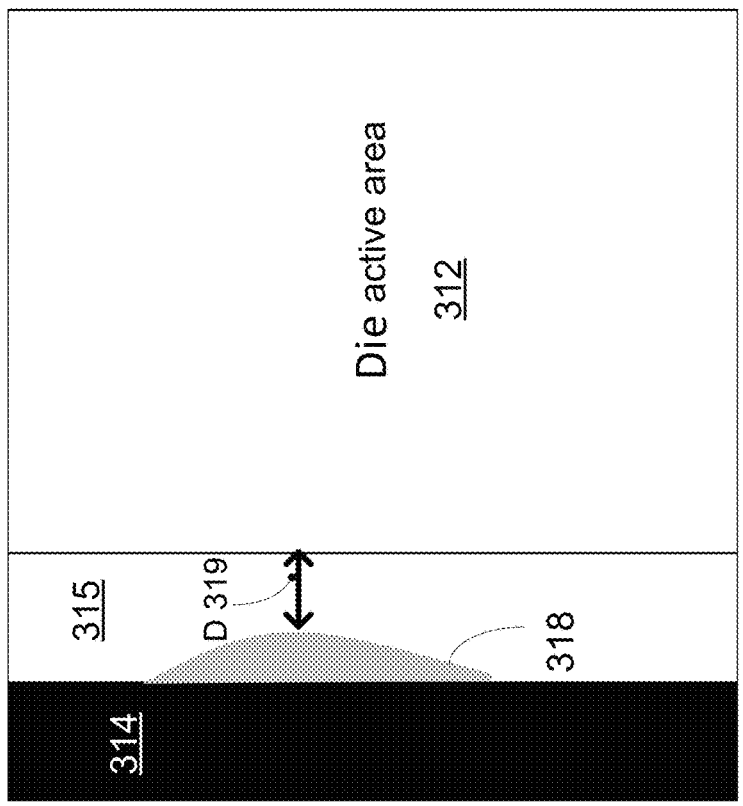
Figure 9:
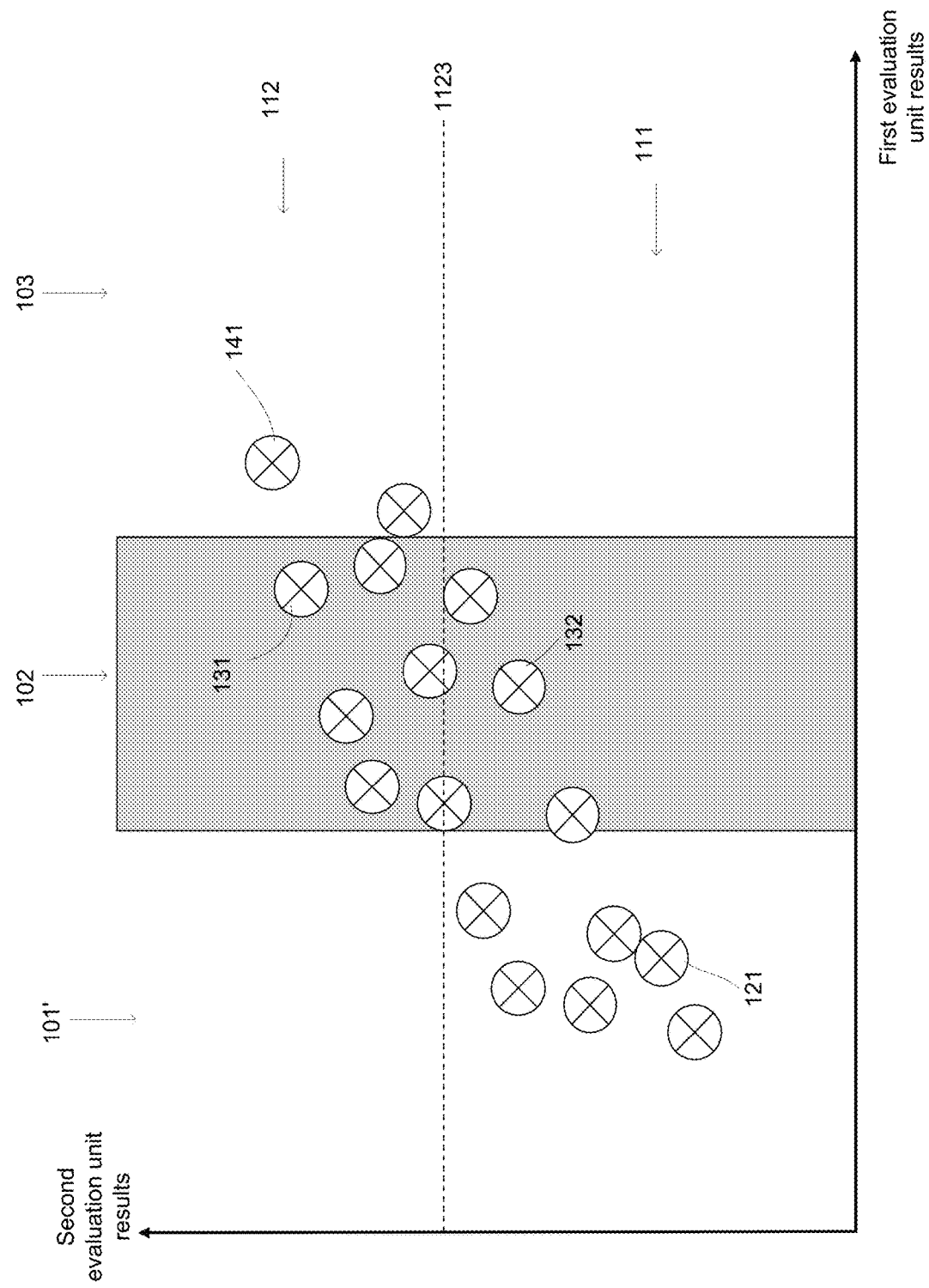
Figure 10:
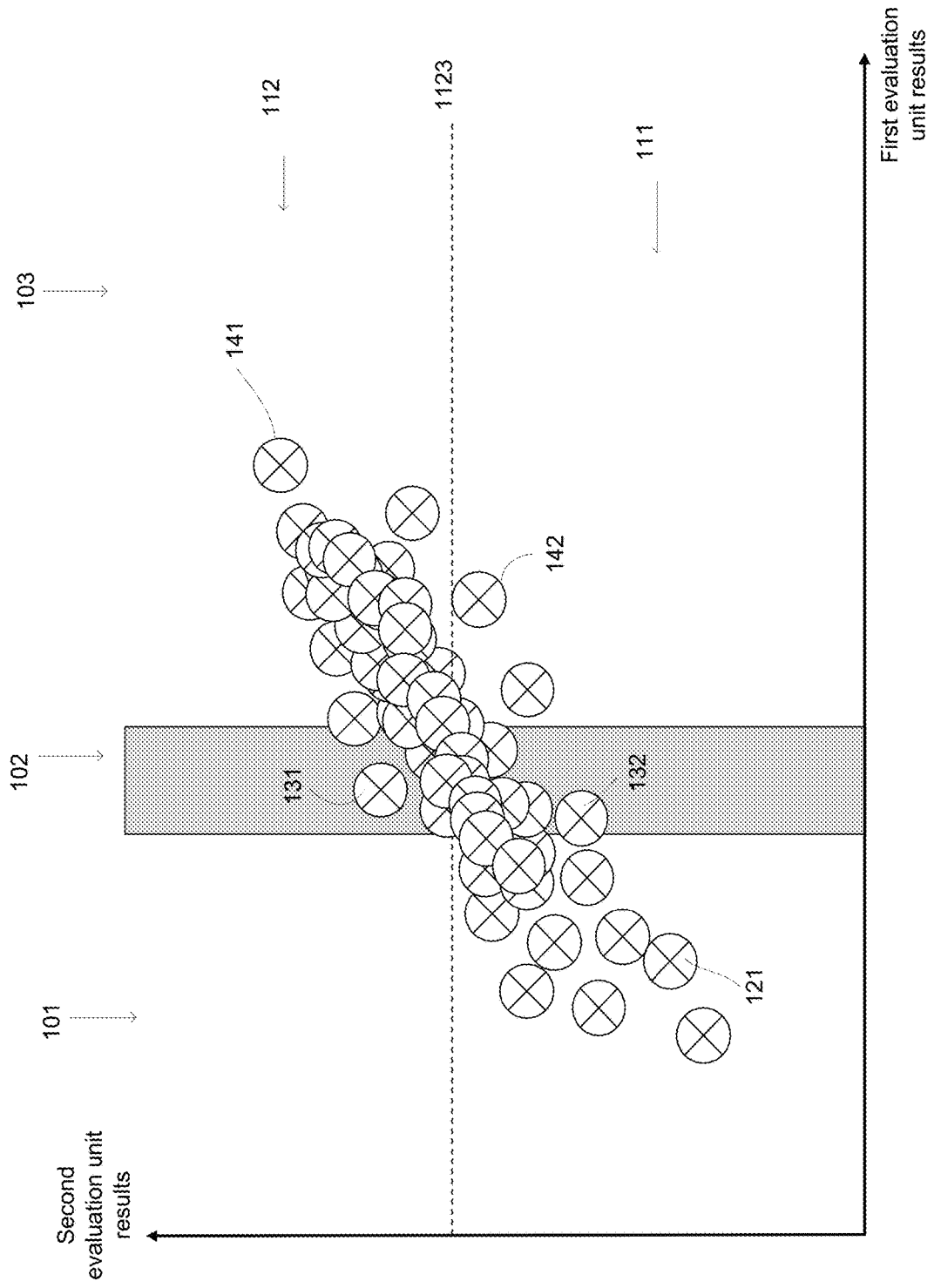
Figure 11:
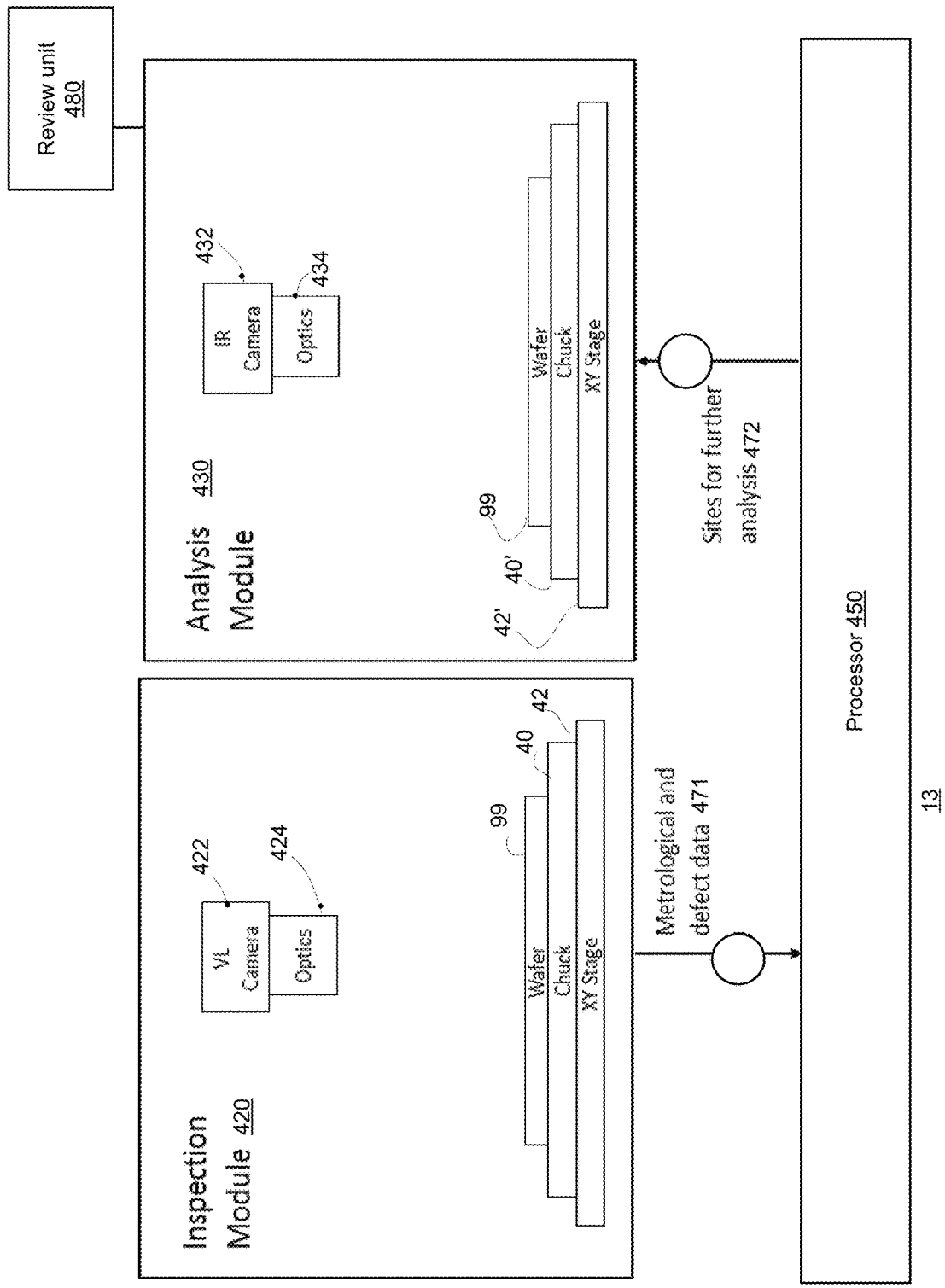
Figure 12:
Figure 13:
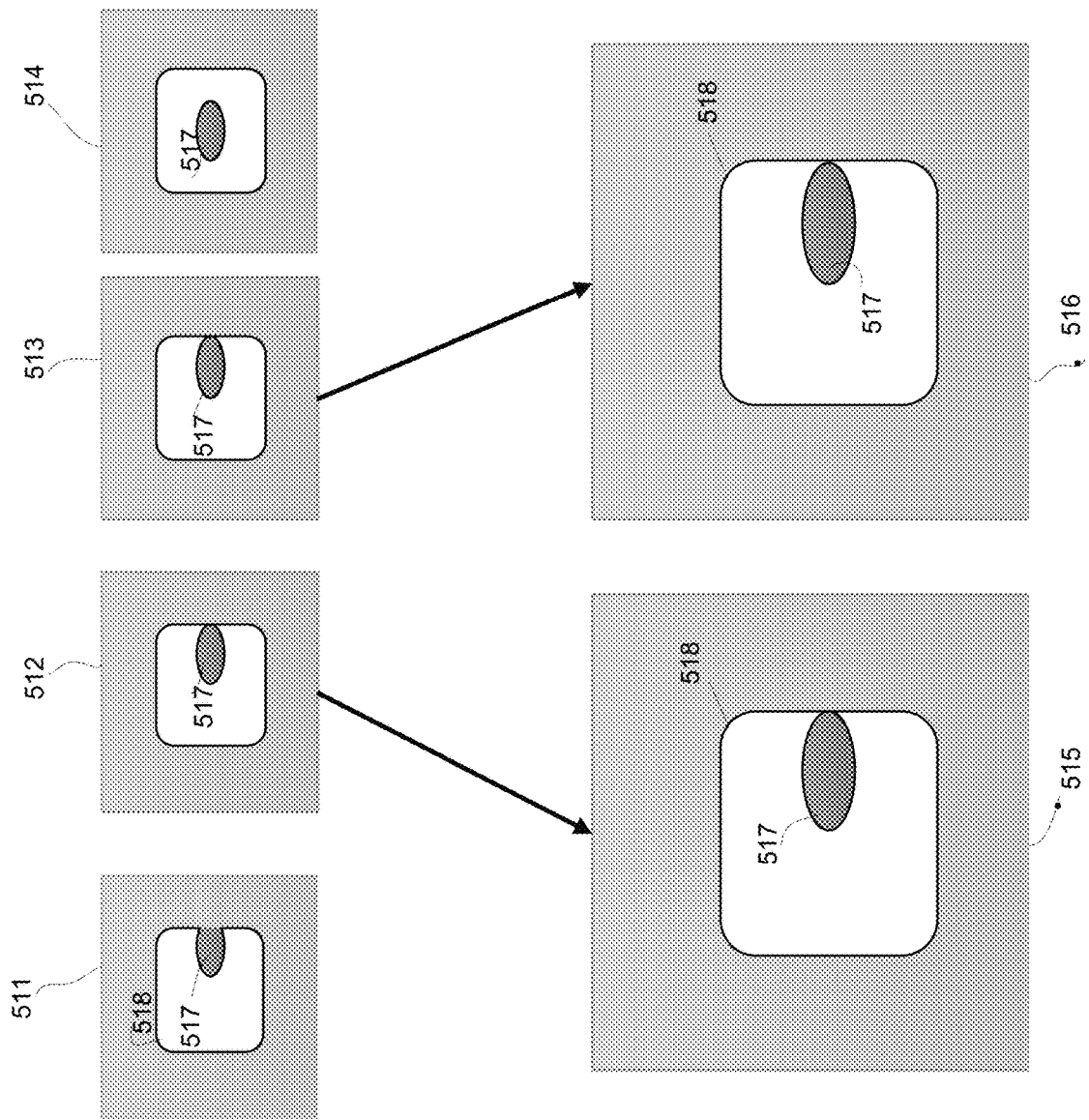
Figure 14:
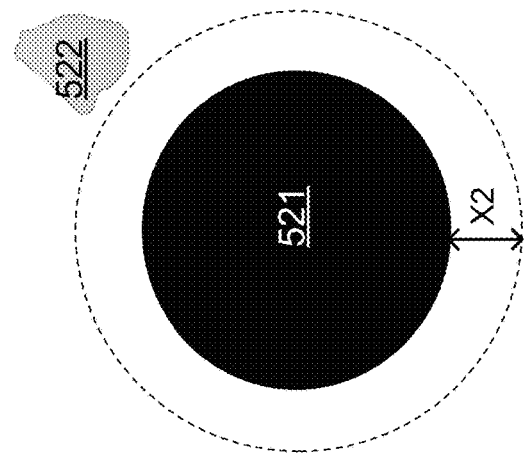
Figure 14:
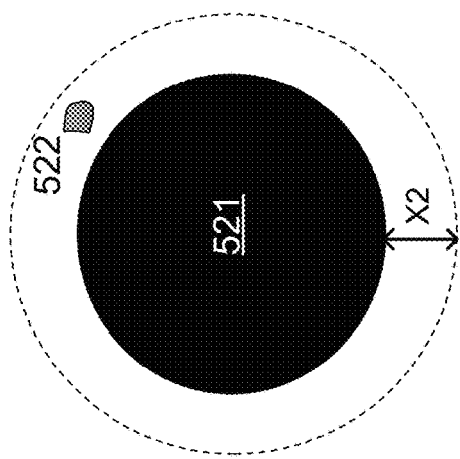
Figure 14:
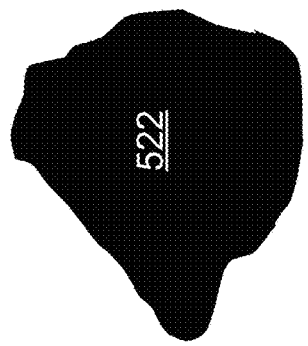
Figure 14:
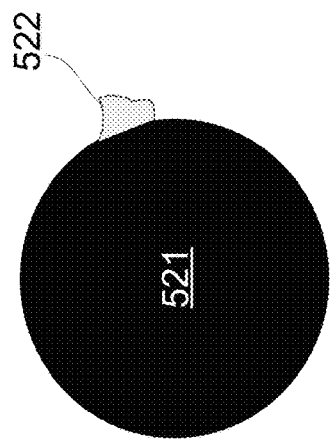
Figure 15:
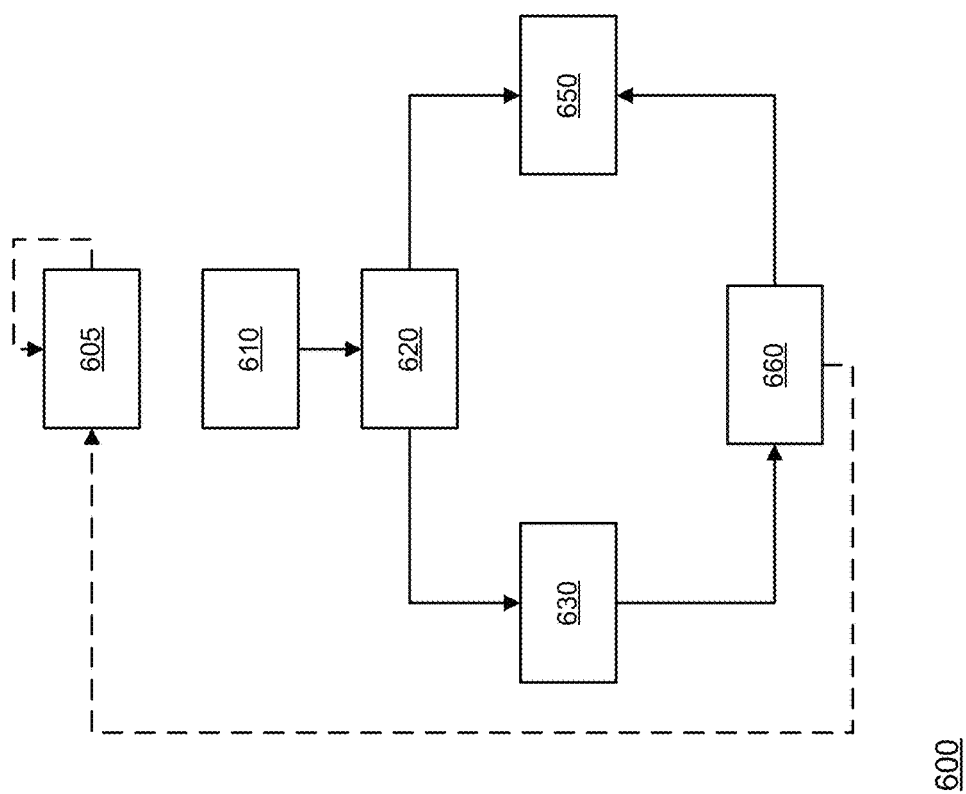

The present invention will be understood and appreciated more fully from the following detailed description taken in conjunction with the drawings in which:

FIG. 1 illustrates an example of a system;
FIG. 2 illustrates an example of a coupling;
FIG. 3 illustrates an example of a die analysis pipeline flow;
FIG. 4 is an example of a defect analysis pipeline flow;
FIG. 5 is an example of a hierarchical open loop configuration;
FIG. 6 is an example of a Hierarchical Closed loop configuration;
FIG. 7 is an example of a die;
FIG. 8 illustrates examples of two images of top surfaces of two sites that suffer from an internal crack;
FIG. 9 illustrates an example of a correlation between IR measurements of an internal layer axis) and dark field measurements of visible light;
FIG. 10 illustrates an example of a correlation between IR measurements of an internal layer (y-axis) and dark field measurements of visible light;
FIG. 11 illustrates an example of a kerf inspection system;
FIG. 12 is an example of a a flow chart of the Kerf inspection process;
FIG. 13 illustrates examples of images;
FIG. 14 is an example of a process for defect detection of bumps; and
FIG. 15 is an example of a method for evaluating an object.

DETAILED DESCRIPTION OF THE INVENTION

Because the apparatus implementing the present invention is, for the most part, composed of optical components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

There may be provided a system, method and a computer program product for evaluating an object. The evaluation may include inspection, metrology, analysis, review and the like.

The object is evaluated by a first evaluation and some of the sites of the object may also be evaluated by a second evaluation module.

The second evaluation module is regarded as more reliable than the first evaluation module—at least in the content of evaluating a certain type of defects that is of interest. For example—an infrared analysis module may be more reliable than a visual inspection module when evaluating buried cracks in a silicon die.

The first evaluation module may be faster than the second evaluation module—but this is not necessarily so.

The first evaluation module may have a coarser resolution than the second evaluation module—but this is not necessarily so.

The first evaluation module may be an inspection unit and the second evaluation may be an analysis unit or a metrology unit.

The first evaluation module may differ from the second evaluation by at least one out of frequency of radiation that irradiates the object, intensity of radiation that illuminates the object, angle of illumination, angle of collection of the object, resolution, damage to the object imposed by the evaluation, and the like.

For simplicity of explanation the following examples refer to a first evaluation module that is faster than the second evaluation module.

For simplicity of explanation the following examples refer to an object that is a wafer or a die. Other objects may be evaluated.

The terms "unit", "module", and "system" are used in an interchangeable manner.

There may be provided systems, methods and computer program products for optimizing and monitoring a high-speed module (with limited resolution), using a high resolution (low speed) module.

The microelectronics production process required an accurate repeatable process that is controlled rigorously using automatic inspection or metrology systems.

While inspection concentrates in defining good or bad dice, the metrological information finds deviation in the process. When the deviation reaches the control limit, a corrective action is required. When the process reaches a spec limit the die/wafer is deemed defective.

It is clear that the metrology process accuracy surpasses the inspection process. This usually comes with the cost in the speed.

In order to keep with the throughput requirements of the metrological process, a sampling mechanism is implemented, in which only some measurement points (sites) are being used in order to characterize the wafer properties.

The systems, methods and computer program products may combine a fast throughput capability of a scanning system with the accurate analysis of a metrology/analysis system.

There may be provided a system that includes two kinds of modules, as well as methods for operating the system and computer program products that store instructions to be executed by the system.

A "high speed" module (such as an inspection module) that can efficiently cover the area of the wafer and analyze for defects, and a "high accuracy" module (such as an analyzer) that can analyze a die in a robust way in order to define its status (good/bad).

The speed value is relative between the two and does indicate towards a specific speed. The term "accuracy" may imply that the result from the latter are more trustworthy (reliable) than the former.

FIG. 1 illustrates a system 10 that includes a processor 50, an inspection module 20 and an analysis module 30. The system 10 also includes one or more chucks (such as chuck 40), a mechanical stage (such as XY stage 42), a wafer handling module for loading and unloading the wafer. Each module (inspection, analyzer) may include a separate chuck and/or mechanical stages—or both modules may share the chuck and/or the mechanical stage.

The processor 50 may include one or more hardware integrated circuits, may include multiple cores, may be an ASIC, a FPGA, and the like. The processor may or may not belong to the inspection module, may or may not belong to the analysis module—and may partially belong to the inspection module and partially belong to the analysis module.

The inspection module 20 may be used for general scanning and site location gathering (for example—sites of suspected defects). The inspection module may include a camera 22, optics 24, illumination unit (not shown), and an acquisition unit (not shown).

The analysis module 30 may be used for further analysis of the sites from the inspection module. The analysis module may include a camera 32, optics 34, illumination unit (not shown), and an acquisition unit (not shown).

The system 10 may also include a processor 50 and/or controller, and may include a man machine interface such as a display for user supervision and review.

System 10 has a shared chuck and a shared mechanical stage—that are used by the inspection module and the analysis module.

The system 10 may be operated by the following steps:
a. Loading a wafer to the inspection module.
b. Inspecting the wafer by the inspection module (for example by scanning) and finding relevant sites for further analysis. The sites for further analysis may be found based on user specification such as defects, defect location and so on (for defects). In other cases, the user may set the sites based on specific measurements made by the system in the scanning stage (regardless to being a defect or not).
c. Feeding the relevant sites (at least their locations and maybe additional metadata) to the analysis module.
d. Acquiring additional information by the analysis module regarding the sites (color data, IR image, 3d profiling and so on).
e. Analyzing, by the analysis module, the additional information (and maybe the information from the inspection module) to establish a characterization of the sites (measurement value, defect type and so on).
f. Using this information, the inspection module can then deduce the kind of sites that require this extra analysis and the ones that don't.

The algorithm for the site list generation can be monitored by adding a few "control" sites that are added for the analysis (sites that are used for the internal process stability and monitoring).

This coupling (or mapping) gives a few distinguishable advantages. As the analysis module focuses on the required sites a focused analysis can be performed, hence reducing the time of data gathering. On the other hand, the ability of the inspection module to utilize (automatically) the data from the Analysis module, a result can be deduced based on correlation only, resulting in an accurate quick result.

FIG. 2 illustrates an example of the coupling—when evaluation result (a value or a property) is measured or evaluated, a correlation between evaluation results generated by different modules (such as the inspection module and the analysis module) (of different accuracy that provided the value or property) can be established. Although the built-in difference in accuracy is not mitigated, a site of interest can be established for-which the—time consumption by the further analysis is worthwhile.

For example—the evaluation results provided by the inspection module may be in a certain range and a subset of the evaluation results may be selected as valid—based on evaluation results from the analysis module.

In the graph 100 in FIG. 2—the y-axis illustrates second evaluation results provided by the analysis module and the x-axis lists first evaluation results provided by the inspection module.

Each one of symbols 121, 131, 132, 133, 141 and 142 represent a value of a first evaluation result that is mapped to a value of a second evaluation result. For example—symbol 121 has a y-coordinate that represents a second evaluation result value 1212 and has a x-coordinate that represents a first evaluation result value 1211. The first evaluation result value 1211 is mapped to the second evaluation result value 1212.

The first quadrant is horizontally segmented by two horizontal lines 1121 and 1122 that delimit a proper class 112 of second evaluation results.

The second evaluation results having values between upper horizontal border 1121 and lower horizontal border 1122 indicate that a site having a first evaluation result mapped to any of these second evaluation results is proper—as these values are according to a required specification.

Values of the second evaluation results that are above upper horizontal border 1121 belong to an improper class 113—indicate that a site having a first evaluation result mapped to any of these second evaluation results is improper—as these values are above the required specification.

Values of the second evaluation results that are below lower horizontal border 1122 belong to an improper class 111 indicate that a site having a first evaluation result mapped to any of these second evaluation results is improper—as these values are below the required specification.

The first quadrant is also vertically segmented to a improper segment 101, an indefinite segment 102 and another improper segment 103.

All symbols located within the improper segment 101 represent first evaluation results that are mapped to second evaluation results that belong to improper class 111—indicate that a site having a first evaluation result mapped to any of these second evaluation results is improper—and there is no need to evaluate the site by the second evaluation module.

At least most of the symbols located within the improper segment 103 represent first evaluation results that are mapped to second evaluation results that belong to the other improper class 113—indicate that a site having a first evaluation result mapped to any of these second evaluation results is improper—and there is no need to evaluate the site by the second evaluation module.

Symbol 142 belongs to proper class 112 but in this example it was decided (for example—due to timing constraints) that it does not merit expanding indefinite segment 102 to cover site having these values.

Some of the symbols within indefinite segment 102 belong to proper class 112 (for example symbol 132) while other (such as symbols 131 and 133) belong to one of improper classes 111 and 113. Accordingly—there is a need to check a site having any of the first evaluation result values within this indefinite class with second evaluation module.

The system may work in a die concept in which the die goes over a series of tests. The tests are built in sequence so that only a suspected die is analyzed so that the time for analysis is reduced.

FIG. 3 illustrates an example of a die analysis pipeline flow 200.

Flow 200 starts by scanning the die with inspection module (201), determining if the die may is suspected as a defective die (202)—if not accepting die (206)—else analyzing the die (203), checking whether (based on the analysis) the die is defective (204)—of not accepting die (206) is not—scraping the die (205). Other responses to the outcome of the inspection and/or analysis may be provided (instead or addition to steps 205 and 206).

In some cases, however, it is easier to look at the process from a defect point of view in which sites are selected from the list of "defect" (suspected abnormalities) to be analyzed.

The abnormalities will not be analyzed if deemed real, and so the die is scrapped without the lengthy analysis process.

See FIG. 4 which is an example of a defect analysis pipeline flow 210 that includes: scanning a die with inspection module (211), determining if there is an actual or suspected defect on the die (212)—if not accepting die (217)—else checking if the first evaluation result related to the die is faulty—is there a false alarm (213)—if no scrapping the die (216)—else analyzing the defect (214), checking whether (based on the analysis) the defect is real (215)—if not accepting die (217) is not—scraping the die (216).

Other responses to the outcome of the inspection and/or analysis may be provided (instead or addition to steps 216 and 217).

After the performance of the analysis, a correlation data between the inspection and analysis modules may be executed.

The system may be utilized in order to reduce the necessity for analysis later on. This is a "closed loop" approach where the system can control and teach itself for optimized time by minimizing the time used for the analysis.

FIG. 5 that illustrates a hierarchical open loop configuration.

System 11 of FIG. 5 includes separate chucks (chuck 40 and XY stage 42 of inspection module 20 as well as chuck 40' and XY stage 42' of analysis module 20.

The inspection module 20 may be used for general scanning and site location gathering (for example—sites of suspected defects). The inspection module may include a camera 22, optics 24, illumination unit (not shown), and an acquisition unit (not shown).

The analysis module 30 may be used for further analysis of the sites from the inspection module. The analysis module may include a camera 32, optics 34, illumination unit (not shown), and an acquisition unit (not shown).

System 11 may also include a processor 50 and/or controller, and may include a man machine interface such as a display for user supervision and review.

In an open loop configuration, sites are selected for secondary analysis in order to further investigate sites that are in either "hot spots" that are interesting for the process characterization or suspected sites that may be in the specification limits and require more robust measurement.

The process is governed by fixed decision making that can be changed by user intervention.

FIG. 6 illustrates a Hierarchical Closed loop configuration.

System 12 of FIG. 6 differs from system 11 by the exchange of information and/or commends between processor 50, inspection module In the Closed loop configuration, the site selection for analysis, still governed by the same merits as the open loop configuration, utilizing on the actual feedback from the analysis module, can optimize the site selection process according to the requirements set by the user.

In the closed loop configuration, for-which the data from the analysis module could be utilized for the site selection process, the data (sites status and metrological information 73) from the analysis tool is regularly correlated to the data gathered in the inspection module. The additional (and updated) data can be utilized (correlation data for inspection and metrology tuning 74) to both enhance the boundaries of the sites that should or should not be analyzed and for calibration adaptations.

Open Loop Example—Kerf Inspection

Wafer includes multiple dice that are separated from each other by streets, whereas each street includes a Kerf section that should be spaced apart from the dice that surround the street. The dice are separated from each other by dicing the Kerf.

During the dicing process, cracks may appear in the dice. While a visual light two dimensional inspection module may detect an internal crack, it may not be able to quantify the penetration of the internal crack to the active area of the die and so additional data may be needed, such as data acquired during an infra-red analysis. The infra-red analysis can also include an inclined analysis of the die facet or any other mean of accurate analysis for the crack.

The top of FIG. 7 illustrates a die 300 that has an external crack 302 that can be easily detected by the visual light two dimensional inspection module but also may include an internal crack that may be evaluated by an infra-red analysis module.

The center of FIG. 7 illustrates an image of a site that includes an internal crack. The image 310 was acquired by a visual light two dimensional inspection module and shows the Kerf section 314 and a boundary 318 of a peeled part of the die that was elevated due to the (unseen) internal crack.

Using a variety of optical inspections techniques, the appearance of such peeling may be detected. The extent of the internal crack that caused peeling is difficult to assess in such indirect way.

The user may specify any change in the street area for analysis (using dark field illumination, the change in angle of reflection can generate a bright object in the "peeling" area). As the status of the die is governed by the level of penetration into the active area of the die "active" area, an IR tool can be utilized for measurement of this penetration.

The bottom of FIG. 7 illustrates a cross section of a die active area 312, Kerf section 314, a region 315 between the Kerf section and the active die area 312, and street 311. The internal crack 316 appears as reaching the die active area 312.

FIG. 8 illustrates two images of top surfaces of two sites that suffers from and internal crack. The peeled region 318 of the left site is located at a distance D 319 from the die active area 312. The peeled region 318 of the right site is located at a distance D' 319' from the die active area 312. Distances D and D' are the minimal distance between any part of the peeled region and the die active area.

The values of the distance that can be regarded as indefinite or belong to any definitive class may be known, may change over time, and the like.

The distance between the peeled region and the die active area is an example of a first evaluation result.

FIG. 9 illustrates a correlation between IR measurements of an internal layer (y-axis) and dark field measurements of visible light (VL) (x-axis—external inspection).

Horizontal line 1123 segments the first quadrant to IR measurement values that belong to improper class 111 and to IR measurement values that belong to proper class 112.

The first quadrant is also vertically segmented to proper segment 101', an indefinite segment 102 and another improper segment 103.

All symbols located within the proper segment 101' represent first evaluation results that are mapped to second evaluation results that belong to proper class 111—and thus indicates that a site having a first evaluation result mapped to any of these second evaluation results is proper—and there is no need to evaluate the site by the second evaluation module.

All symbols located within the improper segment 103 represent first evaluation results that are mapped to second evaluation results that belong to improper class 112—and thus indicates that a site having a first evaluation result mapped to any of these second evaluation results is improper—and there is no need to evaluate the site by the second evaluation module.

Some of the symbols located within the indefinite segment 103 represent first evaluation results that are mapped to second evaluation results that belong to improper class 112—while some other symbols located within the indefinite segment 103 represent first evaluation results that are mapped to second evaluation results that belong to proper class 111. This indicates that a site having a first evaluation result mapped to any of these second evaluation results is indefinite—and there is a need to evaluate the site by the second evaluation module.

FIG. 10 illustrates a correlation between IR measurements of an internal layer (y-axis) and dark field measurements of visible light (VL) (x-axis—external inspection).

In comparison to FIG. 9—the indefinite segment 103 is decreased (thereby providing a fasted evaluation process)—at the expense of defining various symbols (such as 142) as improper (without checking them by the IR module)—despite the fact that they belong to proper class 111.

Correlating between the two measurements allows the module to define levels of penetration (that would deem the die "good" as they always correlate to actual under penetration (Good Die). Areas that would scrap the die as they always correspond to an over penetration (Bad Die). And area that would require additional analysis in order to reach a clear decision for the die.

In this case, an open loop configuration (manned in which the module is configured) can be used that would determine if an indefinite site is an internal crack and to what extent. This, in turn is binned (associated with a discrete result) for the defect status (internal/external/into-Die) and using this information can define the status of the die (good/bad).

FIG. 11 illustrates an example for kerf inspection system 13.

The system 13 includes separate chucks (chuck 40 and XY stage 42 of inspection module 420 as well as chuck 40' and XY stage 42' of analysis module 20.

The visible light (VL) inspection module 420 may be used for general scanning and site location gathering (for example—sites of indefinite defects). The VL inspection module may include a L light camera 422, optics 424, illumination unit (not shown), and an acquisition unit (not shown).

The infra-red (IR) analysis module 430 may be used for further analysis of the sites from the VL inspection module. The IR analysis module may include an IR camera 432, optics 434, illumination unit (not shown), and an acquisition unit (not shown).

System 13 may also include a processor 450 and/or controller, and may include a man machine interface such as a display for user supervision and review.

Wafers are scanned in the VL—inspection module 420, by analysis of the data from this scan, (indefinite) sites are selected for further analysis. Analysis of these site is performed by the IR analysis module 430 that may determine if an internal crack actually exist and should scrap the die. The user can review the data of the IR analysis module on review unit 480.

FIG. 12 is a flow chart of the Kerf inspection process 500. Process 500 includes loading wafer (501), scanning by an inspection module (502), defining sites for analysis (503), acquiring analysis data for sites (504), analyzing sites (505), save analysis results (506) and unloading wafer (507).

The second image 512 and the third image 513 illustrate a probe mark that may or may not contact the edges of the pad. The distances as appear in the second and third images are mapped to analysis module measured value that being to an indefinite class- and thus require the analysis of by the analysis module. Image 515 illustrates a defective probe mark while image 516 illustrated a proper probe mark.

FIG. 14 and table 1 illustrates a process for defect detection of bumps 521 that involves acquiring images of bumps and their surroundings by an inspection module and determining if an element 522 represents a defect and whether a finer analysis of the images of the inspection module images is required.

In table 1 the term "resolution" is the resolution of the inspection module.

TABLE 1

| Decision after inspection | Distance from bump (d) | Size (s) | Average gray level (gl) | Analysis required? |
|---|---|---|---|---|
| No Defect | Any | $S < X_1 -$ Resolution | Any | No |
| Unclear | D = 0 | $X_1 -$ Resolution $< S < X_1 +$ Resolution | Any | Yes |
| Unclear | D < Resolution | $S > X_1 +$ Resolution | Any | Yes |
| Defect | D > Resolution | $S > X_1 +$ Resolution | Any | No |
| No Defect | 0 > D > Diameter * 0.25 | $S < X_2 -$ Resolution | Any | No |
| unclear | 0 > D > Diameter * 0.25 | $X_2 -$ Resolution $< S < X_2 +$ Resolution | Any | Yes |
| Defect | 0 > D > Diameter * 0.25 | $S > X_2 +$ Resolution | Any | No |
| No Defect | D > Diameter * 0.25 | $S < X_3 -$ Resolution | Any | No |
| Unclear | D > Diameter * 0.25 | $X_3 -$ Resolution $< S < X_3 +$ Resolution | Any | Yes |
| No Defect (Dust) | D > Diameter * 0.25 | $X_3 +$ Resolution $< S < X_4 -$ Resolution | GL < Dust GL (Dust is generally darker than any other defect) | No |
| Defect | D > Diameter * 0.25 | $X_3 +$ Resolution $< S < X_4 -$ Resolution | GL > Dust GL | No |
| Unclear | D > Diameter * 0.25 | $X_4 -$ Resolution $< S < X_4 +$ Resolution | Any | Yes |
| Defect | D > Diameter * 0.25 | $S > X_4 +$ Resolution | Any | No |

The Kerf inspection open loop process allows an increase in the production yield due to the saving of dice with suspected defects that are not actual defects as they do not pass the rejection threshold.

The number of sites can be automatically reduced to minimum by the system as the correlation between the required result and the analysis feedback advances.

FIG. 13 illustrates four images 511, 5112, 513 and 514 acquired by an inspection module of a first resolution and two images 515 and 516 acquired by an analysis module of a finer resolution.

These images illustrate a probe mark 517 that should not contact the edges of a pad 518. There is a mapping between the distance as measured by the inspection module and the more accurate distance measured by the analysis module.

The first image 511 illustrates a probe mark that clearly contacts the edges of pad 518 and thus the probe mark is defective—and there is no need to analyze that probe mark by the analysis module.

The fourth image 514 illustrates a probe mark that clearly is spaced apart from the edges of pad 518—and thus the probe mark is proper defective—and there is no need to analyze that probe mark by the analysis module.

FIG. 15 illustrates a method 600 for evaluating an object.

Method 600 may include step 605 of receiving or defining classes of second evaluation results. The classes may be changed over time or may be fixed. The classes may be changes based on outcomes of one or more iterations of steps 610-650.

The classes may include an indefinite class and one or more definite classes. An indefinite class requires an evaluation by a second evaluation module while a definite class does not require an evaluation by the second evaluation module.

The definition of the indefinite class may provide a tradeoff between accuracy and the duration of the overall evaluation process. Evaluating a site by both the first and second evaluation modules is lengthier than checking a site only by the first evaluation module. On the other hand—a reduction of the indefinite class may require to tag proper sites as faulty (see for example symbol 142 of FIG. 10).

Method 600 may also include step 610 of evaluating a region of the object by a first evaluation module to provide first evaluation results that are related to multiple sites of the region. The region may cover the entire object or may be only a part of the object.

Step 610 may be followed by step 620 of finding, using a mapping between values of first evaluation results and values of second evaluation results, (a) a first site of the multiple sites that does not require an evaluation by a second evaluation module, and (b) a second site of the multiple sites that requires an evaluation by the second evaluation module. The second evaluation module is more reliable than the first evaluation module.

The mapping may be received or learnt in any manner. For example—the mapping can be learnt by comparing first evaluation results and second evaluating results of the same sites of one or multiple objects.

Step 620 usually include finding multiple first sites and multiple second sites.

The values of the second results are classified to (a) indefinite class that require the evaluation by the second evaluation module, and to (b) at least one definitive class that does not require the evaluation by the second evaluation module.

The first site has a first evaluation result that is mapped to a second evaluation result that belongs to a definitive class. The second site has first evaluation result that is mapped to a second evaluation result that belongs to an indefinite class.

The at least one definitive class may include a faulty class and a proper class. Values of the second results that belong to the faulty class are indicative of a faulty site. Values of the second results that belong to the proper class are indicative of a proper site.

Step 620 may be followed by steps 630 and 640.

Step 630 may include evaluating the second site by the second evaluation module to provide second evaluation results of the second sites.

Step 630 may not include evaluating the first site by the second evaluation module.

Step 640 may include estimating, based on first evaluation results of the first site and on the mapping, a state of the first site.

Step 640 may include estimating the state of the first site as proper when a first evaluation result related to the first site is mapped to a second evaluation result value that belongs to the proper class. Step 640 may also include estimating the state of the first site as faulty when a first evaluation result related to the first site is mapped to a second evaluation result value that belongs to the faulty class.

Steps 630 and 640 may be followed by step 650 of providing an evaluation of the region based on the state of the first site, and on the second evaluation result of the second site.

The number of evaluation modules may exceed two and the amount of evaluations per site may exceed two. For example—step 630 may be followed by determining whether (based on mapping between second evaluation results and third evaluation results provided by a third evaluation module that is more reliable than the second evaluation module) there are sites that should be further evaluated by the third evaluation module—and if son evaluating these sites by the third evaluation module. There may be any number of iterations and any number of evaluation module.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The application is not limited to 2D and may expand to 3D inspection. The inspected substrate is not limited to a wafer and may include any type of substrate, especially flat substrates such as a printer circuit board, a solar panel, a MEMS device and the like.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

We claim:

1. A method for evaluating an object, the method comprises:
    evaluating a region of the object by a first evaluation module to provide first evaluation results that are related to multiple sites of the region;
    finding, using a mapping between values of first evaluation results and values of second evaluation results, (a) a first site of the multiple sites that does not require an evaluation by a second evaluation module, and (b) a second site of the multiple sites that requires an evaluation by the second evaluation module; wherein the second evaluation module is more reliable than the first evaluation module;

evaluating the second site by the second evaluation module, while not evaluating the first site by the second evaluation module, to provide second evaluation results of the second sites;

wherein the values of the first evaluation results are classified to a class out of (a) an indefinite class that requires the evaluation by the second evaluation module, and (b) at least one definitive class that does not require the evaluation by the second evaluation module;

estimating, based on first evaluation results of the first site and on the mapping, a state of the first site; and providing an evaluation of the region based on the state of the first site, and on the second evaluation result of the second site.

2. The method according to claim 1 wherein the values of the second results are classified to a indefinite class that require the evaluation by the second evaluation module, and at least one definitive class that does not require the evaluation by the second evaluation module.

3. The method according to claim 1 comprising finding the first site when a first evaluation result related to the first site is mapped to a second evaluation result value that belongs to the at least one definitive class; and finding the second site when a first evaluation result related to the second site is mapped to a second evaluation result value that belongs to the indefinite class.

4. The method according to claim 1 wherein the at least one definitive class comprises a faulty class and an proper class; wherein values of the second results that belong to the faulty class are indicative of a faulty site; and wherein values of the second results that belong to the proper class are indicative of a proper site.

5. The method according to claim 4 comprising estimating the state of the first site as proper when a first evaluation result related to the first site is mapped to a second evaluation result value that belongs to the proper class; and estimating the state of the first site as faulty when a first evaluation result related to the first site is mapped to a second evaluation result value that belongs to the faulty class.

6. The method according to claim 1 comprising changing a boundary of at least one class over time.

7. The method according to claim 1 comprising defining the indefinite class based on a timing constraint imposed on the evaluation of the region.

8. The method according to claim 1 wherein the first evaluation module is an inspection unit and the second evaluation is an analysis unit.

9. The method according to claim 1 wherein the first evaluation module is an inspection unit and the second evaluation is a metrology unit.

10. The method according to claim 1 wherein the first evaluation module differs from the second evaluation by a frequency of radiation that irradiates the object.

11. A non-transitory computer readable medium for evaluating an object, that stores instructions for:

evaluating a region of the object by a first evaluation module to provide first evaluation results that are related to multiple sites of the region;

finding, using a mapping between values of first evaluation results and values of second evaluation results, (a) a first site of the multiple sites that does not require an evaluation by a second evaluation module, and (b) a second site of the multiple sites that requires an evaluation by the second evaluation module; wherein the second evaluation module is more reliable than the first evaluation module;

evaluating the second site by the second evaluation module while not evaluating the first site by the second evaluation module, to provide second evaluation results of the second sites;

wherein the values of the first evaluation results are classified to a class out of (a) an indefinite class that requires the evaluation by the second evaluation module, and (b) at least one definitive class that does not require the evaluation by the second evaluation module;

estimating, based on first evaluation results of the first site and on the mapping, a state of the first site; and providing an evaluation of the region based on the state of the first site, and on the second evaluation result of the second site.

12. The non-transitory computer readable medium according to claim 11 wherein the values of the second results are classified to a indefinite class that require the evaluation by the second evaluation module, and at least one definitive class that does not require the evaluation by the second evaluation module.

13. The non-transitory computer readable medium according to claim 11 that stores instructions for finding the first site when a first evaluation result related to the first site is mapped to a second evaluation result value that belongs to the at least one definitive class; and finding the second site when a first evaluation result related to the second site is mapped to a second evaluation result value that belongs to the indefinite class.

14. The non-transitory computer readable medium according to claim 11 wherein the at least one definitive class comprises a faulty class and an proper class; wherein values of the second results that belong to the faulty class are indicative of a faulty site; and wherein values of the second results that belong to the proper class are indicative of a proper site.

15. The non-transitory computer readable medium according to claim 14 that stores instructions for estimating the state of the first site as proper when a first evaluation result related to the first site is mapped to a second evaluation result value that belongs to the proper class; and estimating the state of the first site as faulty when a first evaluation result related to the first site is mapped to a second evaluation result value that belongs to the faulty class.

16. The non-transitory computer readable medium according to claim 11 that stores instructions for changing a boundary of at least one class over time.

17. The non-transitory computer readable medium according to claim 11 that stores instructions for defining the indefinite class based on a timing constraint imposed on the evaluation of the region.

18. The non-transitory computer readable medium according to claim 11 wherein the first evaluation module is an inspection unit and the second evaluation is an analysis unit.

19. The non-transitory computer readable medium according to claim 11 wherein the first evaluation module is an inspection unit and the second evaluation is a metrology unit.

20. The non-transitory computer readable medium according to claim 11 wherein the first evaluation module differs from the second evaluation by a frequency of radiation that irradiates the object.

21. A system for evaluating an object, the system comprising a first evaluation module, a processor, and a second evaluation module;
   wherein the first evaluation module is configured to evaluate a region of the object to provide first evaluation results that are related to multiple sites of the region;
   wherein the processor is configured to find, using a mapping between values of first evaluation results and values of second evaluation results, (a) a first site of the multiple sites that does not require an evaluation by a second evaluation module, and (b) a second site of the multiple sites that requires an evaluation by the second evaluation module; wherein the second evaluation module is more reliable than the first evaluation module;
   wherein the second evaluation module is configured to evaluate the second site while not evaluating the first site, to provide second evaluation results of the second sites;
   wherein the values of the first evaluation results are classified to a class out of (a) an indefinite class that requires the evaluation by the second evaluation module, and (b) at least one definitive class that does not require the evaluation by the second evaluation module;
   wherein the processor is configured to estimate, based on first evaluation results of the first site and on the mapping, a state of the first site; and
   wherein the processor is configured to provide an evaluation of the region based on the state of the first site, and on the second evaluation result of the second site.

* * * * *